United States Patent
Li et al.

(10) Patent No.: US 6,899,784 B1
(45) Date of Patent: May 31, 2005

(54) APPARATUS FOR DETECTING CMP ENDPOINT IN ACIDIC SLURRIES

(75) Inventors: Leping Li, Poughkeepsie, NY (US); Steven G. Barbee, Amenia, NY (US); Scott R. Cline, Belle Plaine, MN (US); James A. Gilhooly, Saint Albans, VT (US); Walter Imfeld, Zurich (CH); Werner Moser, St. Gallen (CH); Adrian Siegrist, Zurich (CH); Heinz Stunzi, Zurich (CH); Xinhui Wang, Poughkeepsie, NY (US); Cong Wei, Poughkeepsie, NY (US)

(73) Assignees: International Business Machines Corporation, Armonk, NY (US); EcoPhysics AG, Duernten (CH)

( * ) Notice: Subject to any disclaimer, the term of this patent is extended or adjusted under 35 U.S.C. 154(b) by 89 days.

(21) Appl. No.: 10/185,823

(22) Filed: Jun. 27, 2002

(51) Int. Cl.[7] ............................................. B26B 1/00
(52) U.S. Cl. ........................ 156/345.16; 451/5; 451/41
(58) Field of Search ...................... 156/345.13, 345.16; 451/5, 8, 41

(56) References Cited

U.S. PATENT DOCUMENTS

| | | | |
|---|---|---|---|
| 6,021,679 A | * | 2/2000 | Li et al. .................... 73/863.23 |
| 6,180,422 B1 | * | 1/2001 | Li et al. ......................... 438/5 |
| 6,254,453 B1 | * | 7/2001 | Li et al. ......................... 451/8 |
| 6,324,298 B1 | * | 11/2001 | O'Dell et al. ............... 382/149 |
| 6,334,880 B1 | | 1/2002 | Negrych et al. |
| 6,709,311 B2 | * | 3/2004 | Cerni ............................ 451/5 |

* cited by examiner

*Primary Examiner*—Gregory Mills
*Assistant Examiner*—Sylvia R. MacArthur
(74) *Attorney, Agent, or Firm*—Lisa J. Ulrich

(57) ABSTRACT

An apparatus for measuring ammonia gas concentration in an ongoing chemical mechanical polishing (CMP) cycle utilizing an acidic CMP slurry, having the following components:

a. A transferring means to collect a sample of the acidic CMP slurry;
  b. A converting means to convert the acidic CMP slurry to a basic slurry;
  c. A measuring means to measure the ammonia gas present in the basic slurry;
  d. A detection means to signal the end of an ongoing CMP cycle.

8 Claims, 3 Drawing Sheets

APPARATUS FOR DETECTING CMP ENDPOINT IN ACIDIC SLURRIES

RELATED APPLICATIONS

This application is related to copending U.S. patent application Ser. No. 10/185,818, filed on the same day, entitled "Method for detecting CMP endpoint in an acidic slurry" and assigned to the present assignee and which is incorporated by reference in its entirety.

BACKGROUND OF THE INVENTION

Chemical-mechanical processing (CMP) has been used by the semiconductor industry for a number of chip development generations to ensure planar surfaces during processing. As semiconductor chips and chip processing have become more complex and through time a greater consideration various CMP processes have been developed and used. A CMP process is used over and over again for almost every layer of semiconductor production. Different layers and steps of the overall process have different needs as the materials used differ.

One of the ways to decrease the overall amount of time it takes to process a semiconductor chip is to reduce the number of steps involved in the CMP process, as it is a processing step that occurs over and over again. A number of parties have patented CMP methods that have minimized the number of steps involved with CMP at different points in the overall chip manufacture. One point during the process where CMP is done is during the early stages of chip manufacture when the transistor levels are being formed. As the size of the transistors shrinks and different components like shallow trench isolation (STI) are added, changes in the CMP process have been contemplated. Traditionally, when developing new CMP schemes, developers have tried to continue to use traditional CMP slurries and endpoint detection methods as it reduces the number of factors which must be changed to achieve a viable process change.

When throughput becomes a process engineer's overriding concern the new process steps may require different materials in the form of CMP slurries and/or endpoint detection methods. Several new CMP techniques have been developed that have required the use of new types of CMP slurries. A number of new and different slurry compositions exist. Most slurries can be grouped by families according to the chemical composition and number of components. Each family of slurry tends to have enough physical and chemical properties in common that a common preferable endpoint detection method can be developed. Currently, there is a class of slurries that are called high viscosity slurry (HVS) that contain detectable amounts of ammonium ions prior to processing. Most known endpoint detection methods based on the detection of NH4+/NH3 are not advantageous from a manufacturing standpoint when HVS is used.

Another slurry under development does not use ammonium but it has a pH that is slightly acidic and for that reason the CMP process products are not converted into a chemical compound that is easily detectable using current endpoint detection methods.

Integration of a new endpoint detection method into current generation CMP equipment should also be a consideration. CMP equipment tends to be an integral part of a semiconductor fabrication system. Fabrication equipment placement is a design decision and any endpoint detection scheme that requires additional substantial equipment enhancement would be impractical, if not financially unfeasible in a manufacturing environment. One reason that it would be financially unfeasible to add apparatus have a substantial footprint is that it would require that most of the equipment required to create a semiconductor chip be reorganized. By footprint it is meant the amount of space an apparatus takes up by linear foot.

In current technology endpoint detection methods the slurry to be tested is usually collected from the active pad area. An example of a current technology CMP apparatus is shown in FIG. 5. The underside of workpiece 100 (in this case, as semiconductor wafer) is being polished on a polishing pad 102 in the presence of a slurry. Note that the workpiece is typically held by some sort of carrier but the carrier is not shown for the sake of clarity. As shown, pad 102 rotates as shown by arrow 104. Wafer 100 also optimally rotates as indicated by arrow 106. Slurry is dispensed to pad 102 upstream or in front of wafer 100 and generally moves as indicated by arrows 108 downstream from or behind (i.e. clockwise from) wafer 100. Slurry is usually directly contacted at point 110 and the amount of ammonia in the gas sampled. When the slurry is acidic and ammonium is present instead of ammonia gas then the ammonia gas can not be directly sampled in gas form from point 110.

Thus there remains a need for a CMP endpoint detection apparatus that is capable of detecting endpoint in chemistries that are not compatible with current endpoint detection methods. There also remains a need for a CMP endpoint detection apparatus that has substantially the same footprint as current generation CMP ammonia gas endpoint dection apparatus.

SUMMARY OF THE INVENTION

It is therefore an object of the instant invention to provide a method of utilizing ammonia gas based endpoint detection methods and apparatus for CMP slurries and processes that do not produce ammonia gas.

It is also an object of the instant invention to provide a method and apparatus for transferring slurry such that the ongoing wafer polishing slurry composition and process are not affected.

It is a further object of the instant invention to provide an apparatus for utilizing a method for identifying non-ammonia gas producing endpoint conditions and converting to those endpoint conditions to ammonia gas endpoint conditions so that existing endpoint detection apparatus can be further utilized.

In accordance with the above listed and other objects, we claim an apparatus for measuring ammonia gas concentration in an ongoing chemical mechanical polishing (CMP) cycle utilizing an acidic CMP slurry, comprising:

a. A transferring means to collect a sample of the acidic CMP slurry;

b. A converting means to convert the acidic CMP slurry to a basic slurry;

c. A measuring means to measure the ammonia gas present in the basic slurry;

d. A detection means to signal the end of an ongoing CMP cycle.

DESCRIPTION OF THE DETAILED EMBODIMENTS

Figure 1:
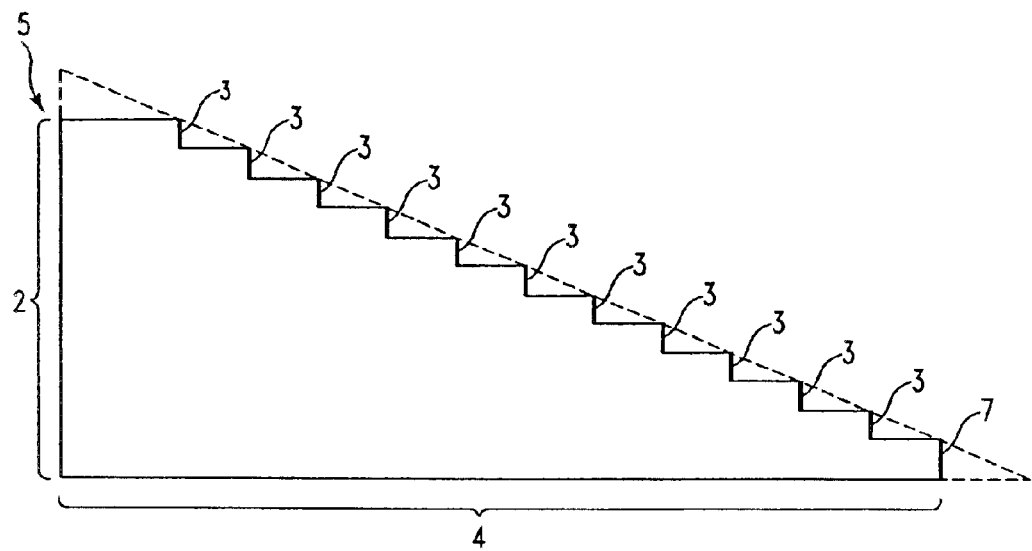
FIG. 1 is a top down view of an exemplar air knife of the instant invention.

Endpoint detection is an important aspect of CMP. The CMP process is not advantageous if it cannot be stopped when necessary. A number of schemes exist which measure the change in chemical properties, temperature, torque and other parameters. There are a number of ways that the slurry could contain ammonium including, but not limited to, 1. the presence of the ammonium in the slurry at the onset of the CMP process and
2. a pH chemistry that inhibits the formation of ammonia gas (usually a chemistry with a pH of less than 7).

There are different ways to approach the problem. In the instant invention, the new method allows for the use of currently available ammonia analyzers, interface boxes and endpoint control algorithms. It is an important feature of the instant invention that the slurry collection take place at the edge of the platen and not on the wafer being polished. According to first embodiment of the present invention a representative sample of the slurry on the wafer being polished is collected. The wafer is not stopped during this collection. If fact, it is important to the instant that, not only is the polishing not stopped during the collection of the slurry, but also that the endpoint detection process not affect the ongoing process. Therefore, the slurry chemistry should remain substantially the same before endpoint detection collection and after endpoint detection collection. By collecting it is meant that slurry to be treated is transferred from the active polishing area. Usually, the slurry is transferred to the edge of the platen beside the polishing pad.

In this first embodiment the parameter that will determine endpoint is ammonia concentration. Once the slurry is collected from the wafer being polished ammonia sampling can take place. The ammonia concentration may not be accurate as the slurry may contain ammonium rather than ammonia. If the collected slurry contains ammonium then an ammonium to ammonia conversion must occur. It should be noted that the conversion cannot impact on the on-going polishing that is happening in parallel to the end-point detection. In this first (and all) embodiments, the slurry is mixed with a solution of sufficiently high pH to convert substantially all of the ammonium to ammonia. The exact pH of the solution after the conversion is not an important consideration, what is important is that the converted, collected solution be substantially ammonium free. Usually, this means a pH of at least 7.0, that is to say that the slurry solution be at least neutral. At room temperature, a preferred pH would be about 11. However, since the amount of ammonia gas present at a given pH is also dependent on temperature, pH alone may not be the only factor affecting ammonium/ammonia gas concentrations at a given pH. For the purposes of this discussion in these embodiments, the temperature is not sufficiently high as to affect the ammonium/ammonia gas concentration at a given pH. It should be noted however that the method and apparatus described herein would be functional in a temperature range sufficiently high as to change the quantities of ammonium/ammonia gas present at a given pH. Once the slurry solution has been treated and the pH is in the desirable range then calculation of the ammonia concentration can proceed using current ammonia gas based endpoint detection technology.

In a second embodiment, a specific chemical composition, a KOH solution (potassium hydroxide), is added to the collected slurry to increase the pH. The KOH solution should be sufficiently basic as to ensure that substantially all of the ammonium potentially present is converted to ammonia. Th pH of the KOH solution could be different depending on the surface being polished and the polishing byproducts created during that processing. It should be noted that the inventors were able to extrapolate the pH value for the scenario described above with relative certainty without knowing the exact ammonium concentration of the collected slurry. This is so because it is possible to extrapolate what would be in all probability the maximum amount of ammonium byproduct that would be created during any interval of the polishing process. The calculation could then be done to calculate the pH necessary to convert that amount of ammonium to ammonia. In a manufacturing environment, the pH of the KOH solution should be at least sufficient to instantaneously convert substantially all of the ammonium to ammonia. Once the conversion occurs current technology ammonia determination could be done. The processing steps outlined for endpoint detection based on ammonia in the first embodiment apply for this second embodiment also.

It is important that endpoint detection processes occur in real time. Since CMP continues until an endpoint condition is reached over polishing can occur if CMP is not ended as soon as possible after endpoint conditions exist. With respect to the endpoint detection method described in the second embodiment large quantities of KOH solution would be required for proper operation in a manufacturing environment. One of the advantages of this invention is its adaptability to current generation endpoint detection methods. The additional equipment needed to accommodate a large vat of KOH solution would not make the instant method easy to assimilate into a current technology CMP apparatus. In a preferred embodiment of the invention an aqueous KOH solution of sufficient pH would be mixed in quantities sufficient to detect the endpoint of at least about one wafer being polished.

One method of mixing smaller quantities of KOH solution would be to dissolve solid KOH pellets in water in a container such that the pH of the solution is equal to a predetermined manner. The container would have a level detector and pellets (and water) would be added when the quantity of aqueous KOH drops below a predetermined level. The container would preferably be small enough to be added to a current technology CMP system without adding significantly to the footprint associated with that system.

It is important to reiterate that the instant method and apparatus are not drawn to a method for detecting ammonia gas, the instant method and apparatus are drawn to a method and apparatus to convert ammonium to ammonia gas so that existing endpoint detection methods that measure ammonia gas can still be used with slurry formulations that are not compatible with ammonia gas production.

An apparatus to accomplish the method of the first and second embodiment is described below. One of the complications in accomplishing the method of the first and second embodiments involves real time collection of the slurry to be tested.

Collection from this location is not usually detrimental to the CMP process because the slurry is not being treated to increase the pH prior to testing. Therefore, there is little chance that the endpoint detection method will affect the CMP process. In the instant invention, the addition of a KOH solution will affect the pH of the CMP slurry itself. Therefore, if the slurry to be tested is collected and treated in the active CMP area it would affect the operation of the CMP process, possibly rendering it ineffective. For that reason, slurry collection must take place, at least, at the edge of the polish table beside the polishing pad. More preferably, slurry collection takes place at the edge of the platen that the wafer rests upon. Once slurry is collected at the edge of the platen, it is treated and ammonia sampling takes place. However, since the actual polishing does not take place at the edge of the platen, the slurry present there may or may not be representative of the slurry composition in the active polishing area. That is to say, the ammonium concentration in the slurry at the edge of the platen may not accurately represent the slurry concentration in the active polishing area. It is an important aspect of the instant invention that the slurry collected accurately reflect the amount of ammonium present in the active polishing area.

Since real time collection is not difficult in current generation CMP apparatus, the inventors have developed an apparatus to facilitate the new collection method described in the instant invention. In the instant invention, an air knife apparatus was developed to quicken the delivery of the polishing slurry to the edge of the platen for ammonia sampling. A most preferred embodiment of the instant invention would comprise an air knife. The air knife acts as a slurry wiper. The air knife would ensure that the slurry collected at the edge of the platen accurately reflected the amount of ammonium present in the active polishing area. While many different shapes were contemplated for the air knife, 5, the preferred shape is shown in FIG. 1.

FIG. 1 shows a cross section of a preferred embodiment of the air knife. The air knife is basically triangular in shape, as shown by the dotted line. Further, the air knife, 5, has steps, 3, which further quicken the delivery of the slurry to the edge of the platen. It is preferred, but not required that the steps be of equal height and equally spaced. Additionally, the air knife may be hinged so that it may be moved for cleaning.

Figure 2:
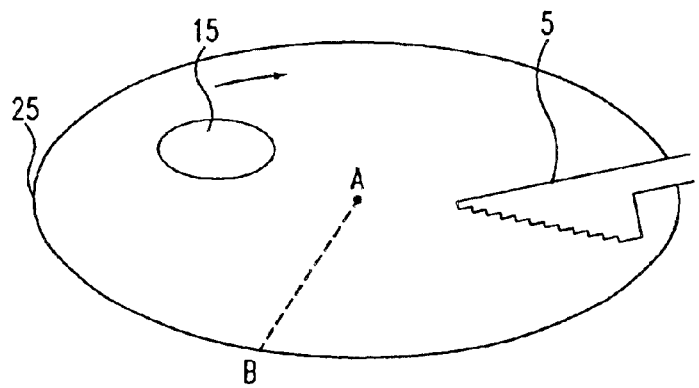
FIG. 2 is a top down view of a slurry sampling scheme.

As shown in FIG. 2, the air knife, 5, is placed over the active polishing area. Since the pH of the slurry may be a factor, the active polishing area is defined as the area of the pad where the slurry pH must not be negatively impacted so as to ensure reliable polishing results for the duration of the polishing cycle. Portions of the platen where the sloughed off slurry is not in contact with the wafer may still be in the active area if there is a chance that the sloughed off slurry will interact and change the pH of slurry that can still contact the wafer being polished. The active polishing area includes, at least, a wafer to be polished, 15, and a pad, 25, on which the wafer rests. The wafer, 15 and the pad, 25, may both have a circular motion independent of each other. While the air knife, 5, may be in contact with the pad for at least a portion of a pad/platen rotation, preferably the air knife does not affect the processing occurring in the active polishing area. The air knife would preferably be positioned such that the length of the longest side of the air knife, (4 in FIG. 1) lies along the dotted A–B line in FIG. 2. Additionally, the narrowest end of the air knife (7 in FIG. 1) would be closest to point A in FIG. 2. Also in a preferred embodiment the platen (25 in FIG. 2) would be rotating towards the steps in the air knife (3 in FIG. 1). In a preferred embodiment, the air knife would be equipped with a mechanism that would further increase the speed at which the slurry to be tested was drawn away from the active polishing area. In a more preferred embodiment that mechanism would employ compressed air.

Figure 3:
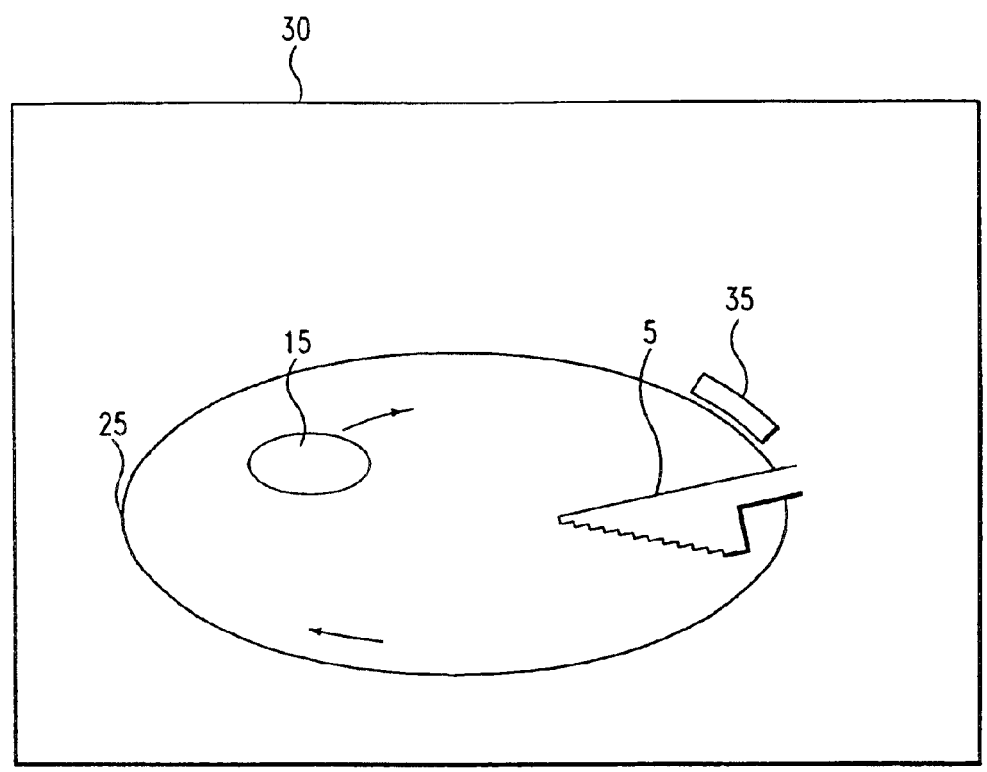
FIG. 3 is a top down view of slurry sampling and pH modification scheme.
Figure 3A:
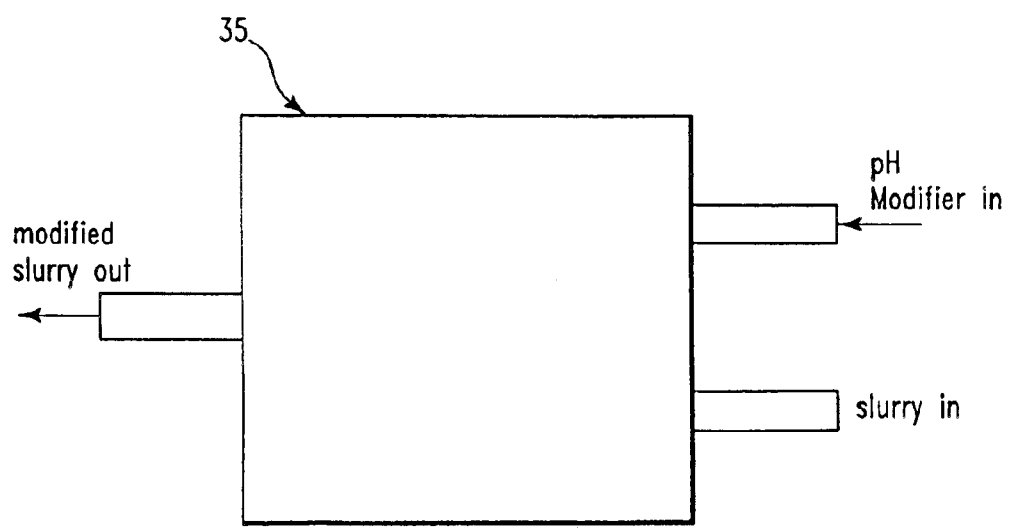

Once the slurry has been drawn off it must be treated with the KOH solution (pH modifier). The KOH treatment can occur in any non-polishing area. Preferably, the KOH treatment would occur in the CMP apparatus, outside of the active area. An example of a location for the KOH treatment apparatus, 35, is shown in FIG. 3, where the platen, 25, is positioned in the CMP apparatus, 30. There are inactive areas in the CMP apparatus that could accommodate the KOH treatment module. The KOH treatment module would interact the KOH solution with the collected slurry. The KOH treatment process for the collected slurry is described above. Again, it is an important element of the instant invention that the pH modified slurry not interact with slurry that is in the active polishing area. FIG. 3a shows a minimal set of inputs and outputs for a preferred KOH treatment module.

Once the collected slurry is treated the ammonia gas concentration would be determined by any means known in the art. The ammonia gas concentration detection would not have to take place in the KOH treatment module, it is contemplated that the treated slurry would have to be transported to an existing location for ammonia gas detection. One example of an available CMP endpoint detection process that may detect the ammonia in the KOH solution treated slurry is as described below.

In an exemplar ammonia endpoint detection scheme, ammonia gas would be produced when the surface to be polished, is substantially completely polished away. The ammonia gas concentrations would increase (ammonia gas created) as the underlying surface (usually a dielectric material such as silicon nitride) reacts with the CMP slurry. The concentration of ammonia gas could be detected by any means known in the art.

The apparatus of the instant invention would convert the collected slurry to ammonia gas and interface with an existing ammonia endpoint detection apparatus. One of the concerns as identified above is interfacing the apparatus of the instant invention with existing endpoint detection apparatus. Since it is a preference, but not a limitation, of the instant invention that the apparatus of the instant invention not substantially increase the footprint of the existing endpoint detection apparatus, an apparatus for supplying a pH modifier, preferably a KOH solution, is disclosed.

In an exemplar pH modifier apparatus, vast quantities of the liquid pH modifier would not be available at any one time. Hereafter, a KOH solution will be used to represent a pH modifier, although the inventors do no intend to be bound to KOH as the sole pH modifier. The exact amount of solution to be made available would depend on the size and shape of the existing current generation ammonia based endpoint detection apparatus. Preferably, the KOH solution reservoir would be of sufficient size to accommodate at least enough liquid KOH to covert substantially all of the ammonium present during one wafer polishing cycle.

Figure 4:
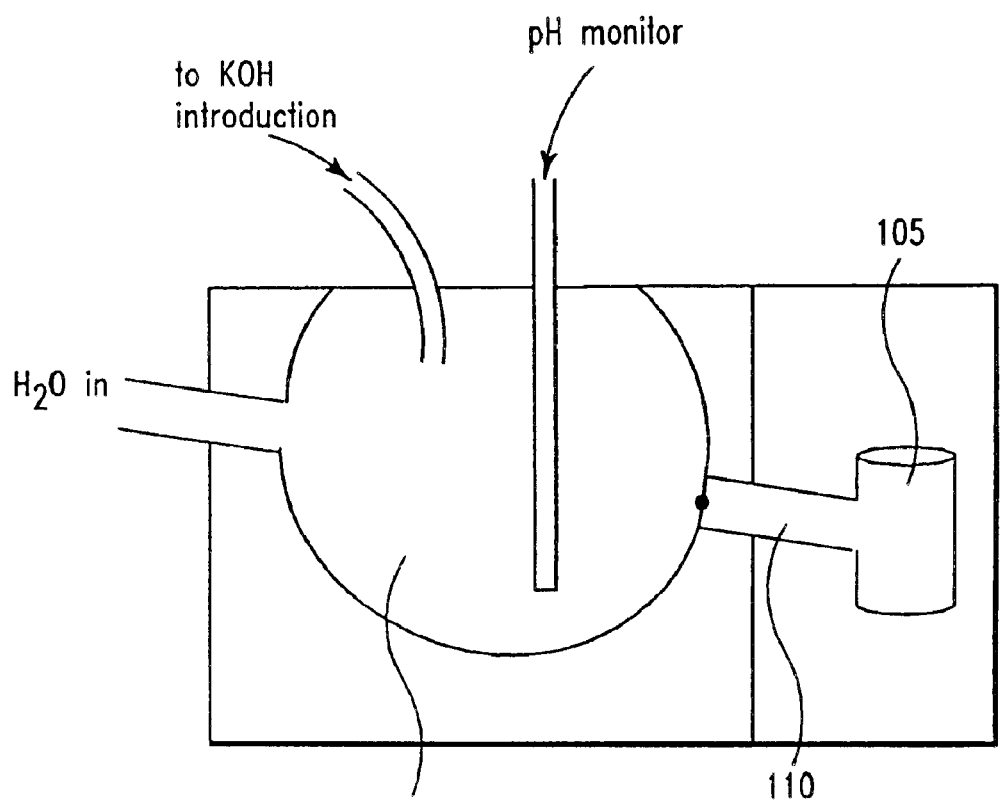
FIG. 4 is a cross sectional view of a pH modifier apparatus.
Figure 5:
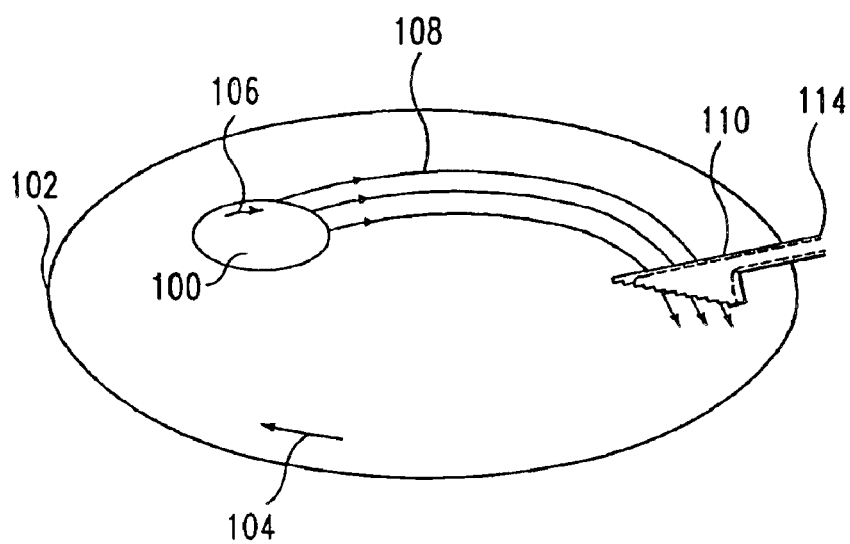
FIG. 5 is a top down view of a current generation slurry sampling apparatus.

In a preferred embodiment, introduction of KOH into the reservoir would be automated. In the preferred embodiment, the reservoir would be "fed" solid KOH pellets which are then dissolved in a suitable liquid, preferably distilled H2O. By fed it is meant that the reservoir receives KOH pellets at intervals such that there is sufficient KOH solution present as needed to convert substantially all of the ammonium present to ammonia gas. In a preferred embodiment, as shown in FIG. 4, a container of solid KOH pellets, 105, would interface with a transporting means, 110, which would introduce the KOH pellets to the reservoir, 115. In a preferred embodiment the concentration of the KOH pellets would be known and the amount of water necessary to dissolve the pellets such that a pH sufficiently high enough to ensure that substantially all of the ammonium present would be converted to ammonia gas would be added. Most preferably, the amount of water added would be amount minimally necessary to dissolve the KOH pellets and maximize pH. It is of course understood that since the size of the reservoir is a consideration in a most preferred embodiment, KOH pellets with a maximal pH could be used and the minimal amount of water necessary to ensure that the pellets had dissolved would be added. It should be noted however, as stated supra, that the instant invention is not limited to KOH solutions of a specific range. It is an element of the instant invention that the pH modifier (KOH solution) be of sufficiently high pH to convert substantially all of the ammonium present at any one time to ammonia gas. That being said, it is not necessary (although it is preferred) that the quantity of KOH pellets transported by the transporting means be monitored. It is contemplated that the reservoir would also have a pH monitoring means which would monitor the pH of the KOH in the reservoir. In such a case, the end user could use the pH of the fluid in the reservoir and quantity in the reservoir as a guide rather than the quantity of pellets and quantity in the reservoir as a guide.

In a preferred embodiment the transporting means would be an auger. Also in a preferred embodiment only as much KOH as could theoretically be needed to convert substantially all of the ammonium present at any one time to ammonia gas would reside in the reservoir at the start of a polishing cycle.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

We claim:

1. An apparatus for measuring ammonia gas concentration in ongoing chemical mechanical polishing (CMP) cycle utilizing an acidic CMP slurry that is absent a presence of ammonia gas, comprising:

a. A transferring means to collect a sample of the acidic CMP slurry;

b. A converting means to convert the acidic CMP slurry to a basic slurry such that, after operation of said converting means, ammonia gas is present in said converted CMP slurry;

c. A measuring means to measure the ammonia gas present in the basic slurry;

d. A detection means to signal the end of an ongoing CMP cycle.

2. The gas measurement apparatus of claim 1 wherein the CMP cycle comprises polishing a semiconductor wafer in a polishing portion of a CMP apparatus, the CMP apparatus having at least two portions.

3. The gas measurement apparatus of claim 2 wherein the transferring means draws the acidic slurry from the polishing portion of the CMP apparatus to the other portion of the CMP apparatus.

4. The gas measurement apparatus of claim 3 wherein the transferring means comprises an air knife.

5. The gas measurement apparatus of claim 4 wherein the transferring means further comprises suction.

6. The gas measurement apparatus of claim 1 wherein the converting means comprises a converting chamber, the chamber containing a fluid capable of converting substantially all of the ammonium present to ammonia gas.

7. The gas measurement apparatus of claim 6 wherein the fluid in the converting chamber modifies the pH of the acidic slurry such that the slurry is at least neutral.

8. The gas measurement apparatus of claim 6 wherein the converting means comprises a supply means.

* * * * *